United States Patent
Mouli

(10) Patent No.: US 7,662,657 B2
(45) Date of Patent: Feb. 16, 2010

(54) TRANSPARENT METAL SHIELDED ISOLATION FOR IMAGE SENSORS

(75) Inventor: Chandra Mouli, Boise, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 214 days.

(21) Appl. No.: 11/523,697

(22) Filed: Sep. 20, 2006

(65) Prior Publication Data
US 2007/0012969 A1 Jan. 18, 2007

Related U.S. Application Data

(62) Division of application No. 10/923,693, filed on Aug. 24, 2004, now Pat. No. 7,297,995.

(51) Int. Cl.
H01L 21/00 (2006.01)
H01L 21/76 (2006.01)

(52) U.S. Cl. .......................... 438/57; 438/424; 438/430; 257/E21.546

(58) Field of Classification Search ................... 438/57, 438/59, 427, 430, 424; 257/E21.545, E21.546
See application file for complete search history.

(56) References Cited

U.S. PATENT DOCUMENTS

| | | | |
|---|---|---|---|
| 5,883,387 A * | 3/1999 | Matsuyama et al. ......... | 250/306 |
| 6,229,194 B1 | 5/2001 | Lizotte | |
| 6,611,037 B1 | 8/2003 | Rhodes | |
| 6,888,214 B2 | 5/2005 | Mouli et al. | |
| 7,060,960 B2 * | 6/2006 | Ohta et al. ................ | 250/214.1 |
| 7,224,011 B2 * | 5/2007 | Jang ............................ | 257/292 |
| 7,351,661 B2 * | 4/2008 | Heo et al. .................... | 438/689 |
| 2002/0089004 A1 | 7/2002 | Rhodes | |
| 2003/0015736 A1 * | 1/2003 | Beyer et al. .................. | 257/221 |
| 2004/0092098 A1 * | 5/2004 | Sudijono et al. ............ | 438/637 |
| 2006/0001059 A1 | 1/2006 | Moult et al. | |

OTHER PUBLICATIONS

D.L. Losee et al., "All-ITO gate, two phase CCD image sensor technology," Proc. of IEDM, p. 397 (2003).

* cited by examiner

Primary Examiner—Tuan N. Quach
(74) Attorney, Agent, or Firm—Dickstein Shapiro LLP

(57) ABSTRACT

An isolation region formed in a substrate and lined with a transparent metal layer. The isolation region provides isolation between adjacent active areas of an integrated circuit structure, for example the inventive region may provide isolation between pixels of a pixel array. Utilizing a transparent material maintains high quantum efficiency of the pixels as photons are not blocked from penetrating into the substrate. In one exemplary embodiment, a shallow trench isolation region is formed in a substrate, lined with an oxide or other dielectric, and an indium-tin-oxide shielding layer is formed over the oxide. The lined trench may then be filled with either the transparent metal material or a transparent insulating material.

20 Claims, 11 Drawing Sheets

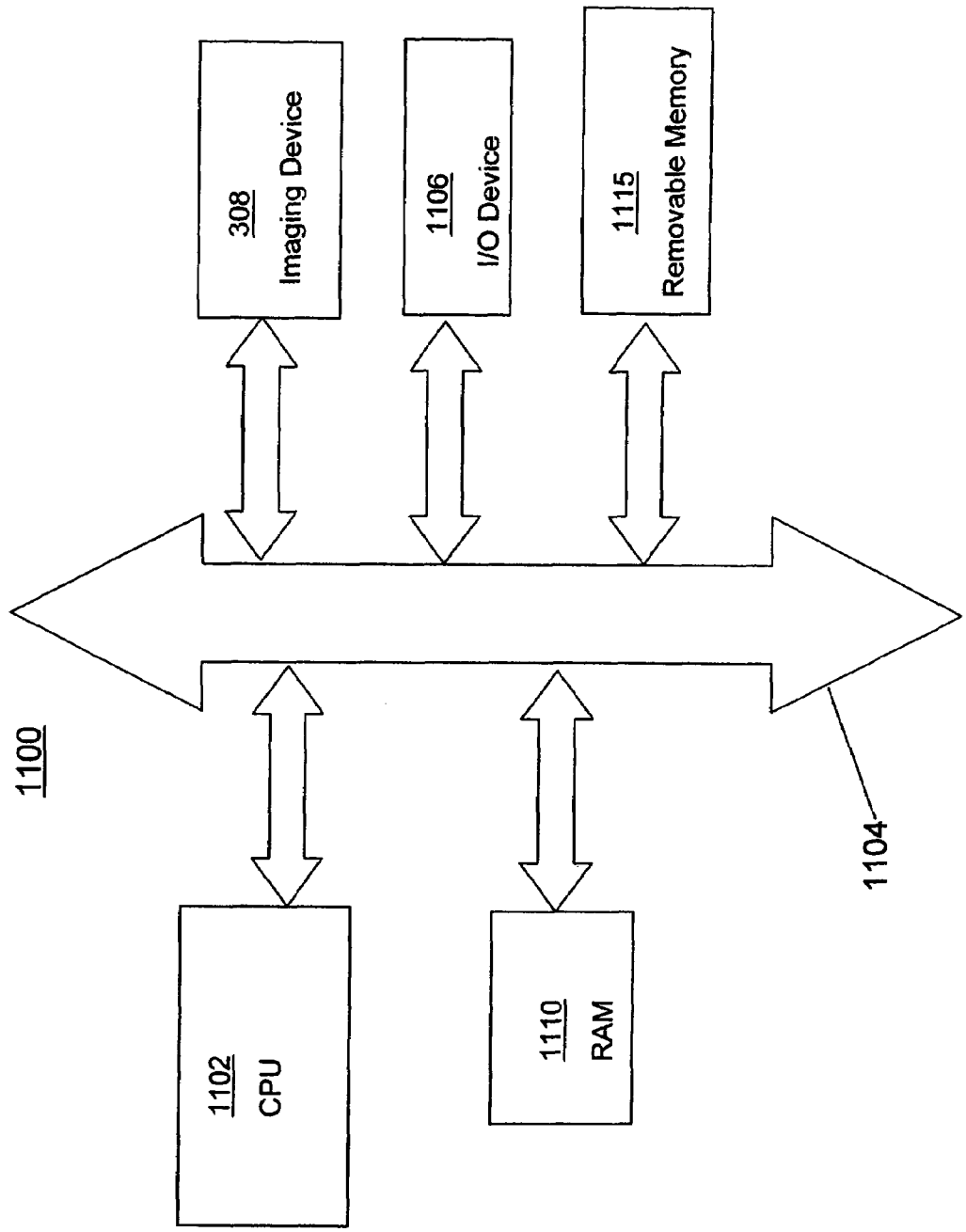

TRANSPARENT METAL SHIELDED ISOLATION FOR IMAGE SENSORS

The present application is a divisional of application Ser. No. 10/923,693, filed Aug. 24, 2004, now U.S. Pat. No. 7,297,995, the entire disclosure of which is incorporated herein by reference.

FIELD OF THE INVENTION

The invention relates generally to an improved isolation structure for high density integrated circuits and, in particular, to an improved isolation region for an image sensor and a process for its formation.

BACKGROUND OF THE INVENTION

CMOS (Complementary Metal-Oxide Semiconductor) imagers are increasingly being used as low cost imaging devices. A CMOS imager circuit includes a focal plane array of pixel cells, each one of the cells including a photosensor, for example, a photogate, photoconductor or a photodiode overlying a substrate for accumulating photo-generated charge in the underlying portion of the substrate. A readout circuit is connected to each pixel cell and includes at least pixel selecting field effect transistor formed in the substrate and a charge storage region formed on the substrate connected to the gate of a transistor coupled to the pixel selecting transistor. The charge storage region may be constructed as a floating diffusion region. The imager may include at least one electronic device such as a transistor for transferring charge from the photosensor to the storage region and one device, also typically a transistor, for resetting the storage region to a predetermined charge level prior to charge transference.

In a so-called four-transistor (4T) CMOS imager, the active elements of a pixel cell perform the necessary functions of (1) photon to charge conversion; (2) accumulation of image charge; (3) resetting the storage region to a known state before the transfer of charge to it; (4) transfer of charge to the storage region accompanied by charge amplification; (5) selection of a pixel for readout; and (6) output and amplification of a signal representing a reset voltage and a signal representing pixel charge. Photo charge may be amplified when it moves from the initial charge accumulation region to the storage region. The charge at the storage region is typically converted to a pixel output voltage by a source follower output transistor.

Exemplary CMOS imaging circuits, processing steps thereof, and detailed descriptions of the functions of various CMOS elements of an imaging circuit are described, for example, in U.S. Pat. No. 6,140,630, U.S. Pat. No. 6,376,868, U.S. Pat. No. 6,310,366, U.S. Pat. No. 6,326,652, U.S. Pat. No. 6,204,524, and U.S. Pat. No. 6,333,205, all assigned to Micron Technology, Inc. The disclosures of each of the foregoing are hereby incorporated by reference herein in their entirety.

Trench isolation regions are an essential part of current fabrication methods for CMOS and other microelectronic circuits. The decreasing dimensions of devices and the increasing density of integration in microelectronic circuits have required a corresponding reduction in the size of isolation structures. This reduction places a premium on reproducible formation of structures that provide effective isolation, while also occupying a minimum amount of the substrate surface.

One isolation technique widely employed in semiconductor fabrication is the shallow trench isolation (STI) region. The STI technique forms trench isolation regions that electrically isolate the various active components formed in integrated circuits. In the STI technique, the first step is the formation of a plurality of trenches at predefined locations in the substrate. This occurs usually through anisotropic etching. After the etching is complete, the trenches are filled with an oxide to complete the STI structure. One major advantage of using the STI technique over the conventional LOCOS (Local Oxidation of Silicon) insulation technique is the high scalability to CMOS IC devices for fabrication at the submicron level of integration. Another advantage is that the STI technique helps prevent the occurrence of the so-called "bird's beak" encroachment, which is characteristic to the LOCOS technique.

In order to provide context for the present invention, a portion of a conventional CMOS image sensor cell 10 is illustrated in FIG. 1. As described in general terms above, incident light causes electrons to accumulate in an n-type region 26 of a photodiode 21. An output signal, which is produced by the source follower transistor having gate 50, is proportional to the number of electrons extracted from the n-type region 26.

Trench isolation regions 15 having sidewalls 16 and a bottom 17 are formed in a p-well active layer 94 and adjacent to the charge photodiode 21, to isolate the cell 10 from adjacent pixel cells. Trench isolation regions 15 are formed using known STI techniques. Specifically, the trenches 15 are etched by employing a dry anisotropic or other suitable etching process, and are filled with a dielectric such as a chemical vapor deposited (CVD) silicon dioxide ($SiO_2$) or other known oxide. The filled trenches 15 are then planarized so that the dielectric remains only in the trenches and their top surface remains level with that of the silicon substrate 20.

As scaling continues to decrease the size of each device, such as pixel cell 10, isolation techniques become increasingly important. Traditional STI fabrication methods have several drawbacks that are intensified by desired scaling. STI regions, such as trench 15, have encountered processing problems such as void prevention, corner rounding, and gap fill. Several techniques have been devised in order to mitigate these negative effects which tend to reduce the isolation capabilities of the STI regions.

Another problem that pixel cells encounter due to scaling occurs when the spacing between the active areas of the pixels is decreased. The effect of the decrease in area is illustrated in FIGS. 2A, 2B, and 2C. When adjacent active areas of a pixel cell, which can be multiple areas within a cell or of adjacent cells, are supplied with different voltages, an electric field is created between the two areas. These electric fields are generally shown in the accompanying drawings, which illustrates that the field may take on many forms depending on the voltage levels applied (see, e.g., Fields F1, F2, and F3). This field, in turn, may provide transportation of electrons between the two active areas. Electrons may even be carried through an isolation region, as typical isolation regions do not block this flow. This undesirably reduces the quantum efficiency of the pixel cell.

There is needed, therefore, an isolation region for use in imager pixels that prevents an electric field penetration between active areas of adjacent pixels without reducing the quantum efficiency of the pixels. There is also a need for a simple method of fabricating the desired isolation regions in pixels.

BRIEF SUMMARY OF THE INVENTION

Exemplary embodiments of the invention provide an isolation region formed in a substrate and lined with a transparent metal layer. The isolation region provides isolation between adjacent active areas of an integrated circuit structure, for example the inventive region may provide isolation between pixels of a pixel array. Utilizing a transparent material maintains high quantum efficiency of the pixels as photons are not blocked from penetrating into the substrate. In one exemplary embodiment, a shallow trench isolation region is formed in a substrate, lined with an oxide or other dielectric, and an indium-tin-oxide shielding layer is formed over the oxide. The lined trench may then be filled with either the transparent metal material or a transparent insulating material.

BRIEF DESCRIPTION OF THE DRAWINGS

Additional advantages and features of the present invention will be apparent from the following detailed description and drawings which illustrate preferred embodiments of the invention, in which:

FIG. 9 illustrates a processor system incorporating a CMOS imager device containing one or more exemplary imager pixels according to the present invention.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The term "substrate" is to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "substrate" in the following description, previous process steps may have been utilized to form regions or junctions in the base semiconductor structure or foundation. In addition, the semiconductor need not be silicon-based, but could be based on silicon-germanium, germanium, or gallium arsenide.

The term "pixel" refers to a picture element unit cell containing a photosensor and transistors for converting light radiation to an electrical signal. For purposes of illustration, a representative pixel is illustrated in the figures and description herein and, typically, fabrication of all pixels in an imager and will proceed simultaneously in a similar fashion.

The term "metal" is intended to include not only elemental metal, but can include metal with other trace metals or in various alloyed combinations with other metals as known in the semiconductor art, as long as such alloy retains the physical and chemical properties of a metal. The term "metal" is also intended to include conductive oxides of such metals when appropriate to the context in which the metal is used.

Figure 8:
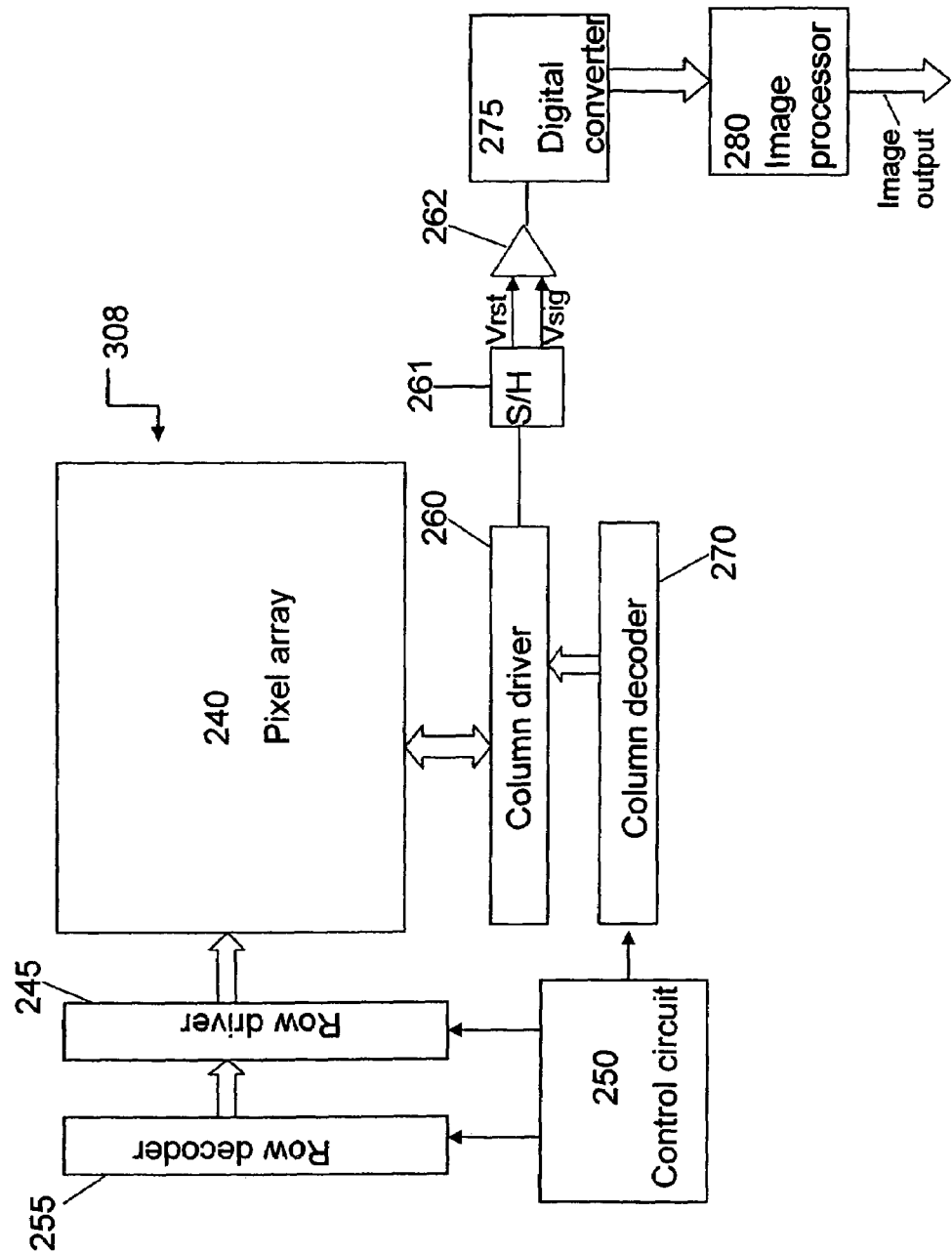
FIG. 8 is a block diagram of an integrated circuit that includes a pixel array having exemplary imager pixels as shown in FIG. 3.

Although the invention is described herein with reference to the architecture and fabrication of one pixel, it should be understood that this is representative of a plurality of pixels in an array of an imager device such as array 240 (FIG. 8) of an imager device 308 (FIG. 8). In addition, although the invention is described below with reference to a CMOS imager, the invention has applicability to other solid state imaging devices having isolated pixels. The invention may also be employed more generally to isolated adjacent photosensitive structures in an integrated circuit device. The following detailed description is, therefore, not to be taken in a limiting sense, and the scope of the invention is defined only by the appended claims.

Figure 3:
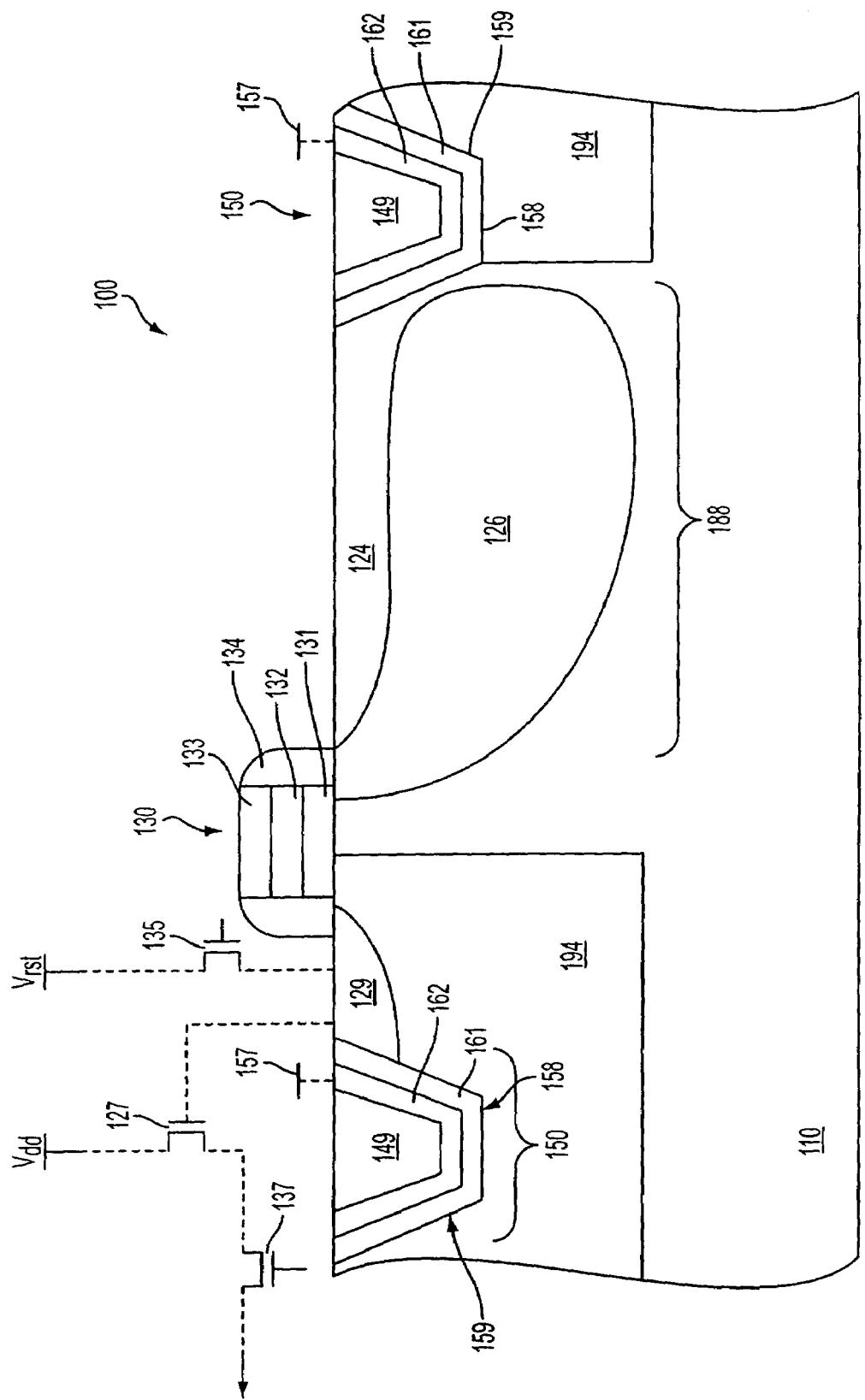
FIG. 3 is a cross-sectional view of a portion of an exemplary imager pixel constructed in accordance with the invention.

Referring now to the drawings, where like elements are designated by like reference numerals, FIG. 3 depicts a portion of an exemplary pixel 100 constructed in accordance with the invention. The pixel 100 contains a photosensitive element 188 which is illustratively a pinned photodiode. It should be understood, however, that the exemplary pixel 100 may include a photogate, photoconductor, or other photon-to-charge converting device, in lieu of a pinned photodiode. The photosensitive element 188 is formed of a p+ type surface region 124, an n-type buried charge accumulation region 126 and the p-type substrate 110. Adjacent either side of the photosensitive element 188 are doped p-wells 194. The p-type wells 194 are formed by applying p-type dopants to selective areas of the substrate 110 up to a desired concentration.

The exemplary pixel 100 also has a transfer transistor 130 formed at a top surface of the substrate 110. The transfer transistor 130 is adapted to transfer charges accumulated in the accumulation region 126 to a storage region 129, which may be a floating diffusion region. The transfer transistor 130 is formed of a dielectric layer 133 over a conductive gate electrode layer 132 over a gate oxide layer 131. Insulating sidewalls 134 are formed on the sides of the transistor gatestack. The gatestack materials may be any material known in the art and consistent with the materials specified for this invention.

The storage region 129 is doped n-type and is electrically connected to a gate of a source follower transistor 127 and a source/drain terminal of a reset transistor 135. The source follower transistor 127 provides an output signal to a row select transistor 137 having a gate for selectively gating the output signal to a pixel array column line 142. The reset transistor 135 resets the storage region 129 to a specified charge level $V_{rst}$ before each charge transfer from the accumulation region 126 of the photosensitive element 188. Transistors 127, 137 are coupled in series, source to drain, with the drain of the source follower transistor 127 also coupled to a voltage source $V_{dd}$ and the source of the row select transistor 137 that is used to selectively connect the pixel cell 100 to readout circuitry via output line 142.

Adjacent either side of the photosensitive element 188 is an isolation region 150. Each isolation region 150 is an isolation trench having sidewalls 159 and a bottom 158 formed in the p-well 194 of the substrate 110. Each isolation region 150 is illustratively a shallow trench isolation (STI) region. The isolation region 150 contains a dielectric layer 161, which is illustratively lining both the sidewalls 159 and the bottom 158 of the trench. The dielectric layer 161 may be formed of any dielectric material, such as silicon dioxide ($SiO_2$), and the layer 161 may be thin, within the range of about 30 to about 200 Angstroms, typically about 60 Angstroms. A transparent metal layer 162 is formed in the isolation region 150 over the dielectric layer 161. The transparent metal layer 162 is illustrated as covering both the sidewalls 159 and the bottom 158 of the trench. It should be understood, however, that other embodiments of the transparent metal layer 162, such as the transparent metal layer 162 only covering the sidewalls 159, are also within the scope of the invention. In a preferred embodiment, the transparent metal layer 162 is formed of indium tin oxide, however, any conductive material that is transparent to photons is appropriate for use in the invention. The remainder of the isolation region 150 is a filler layer 149. The filler layer 149 may be a transparent dielectric material, such as an oxide; or alternatively, the filler layer 149 may be the same material as the transparent conductive layer 162 or formed of a different transparent conductive material from that of layer 162. The layers 149, 161, 162 of the isolation region 150 are planarized so that the layers are coplanar with a top surface of the substrate 110.

Figure 1:
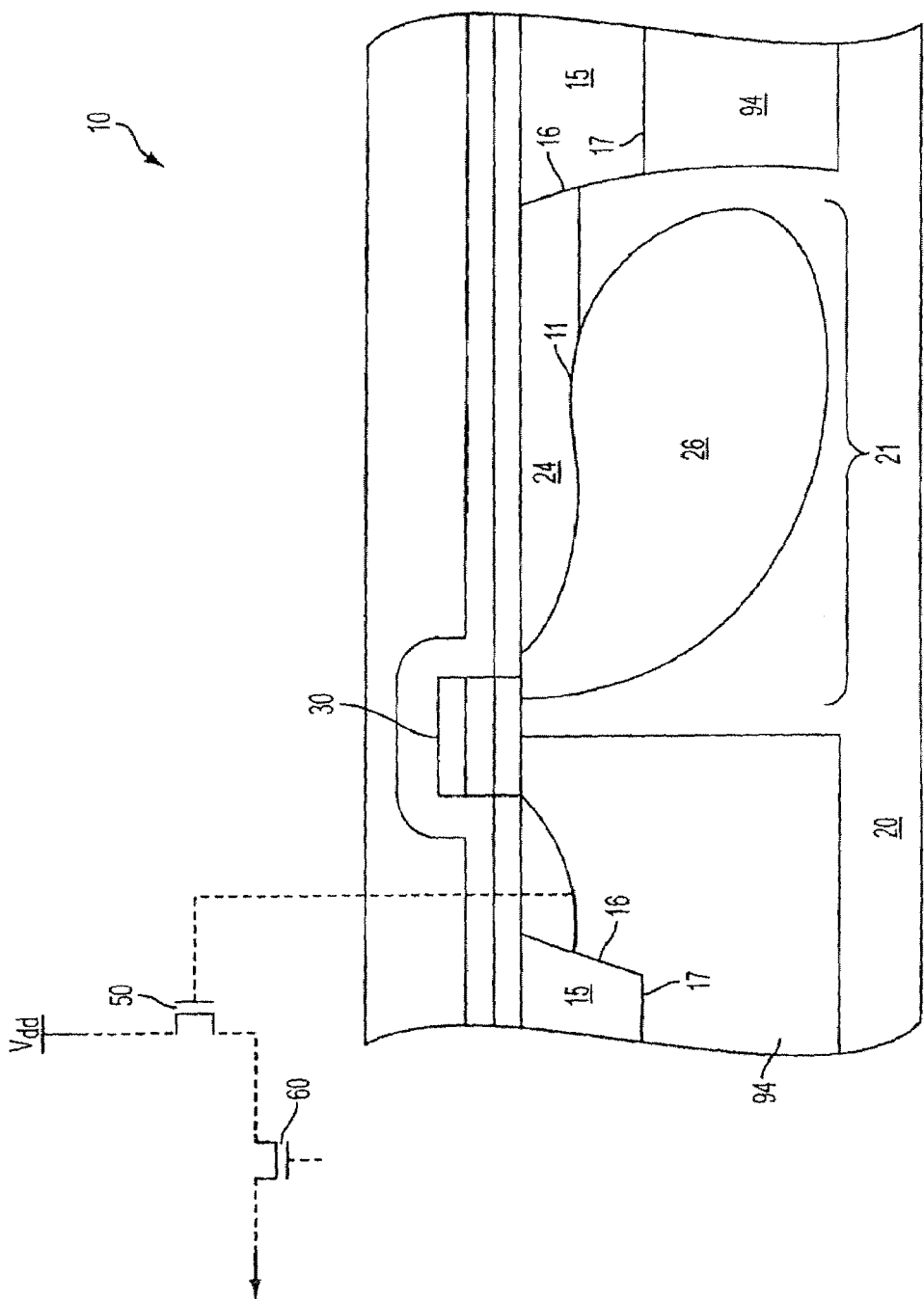
FIG. 1 is a cross-sectional view of a conventional four-transistor pixel cell.
Figure 2A:
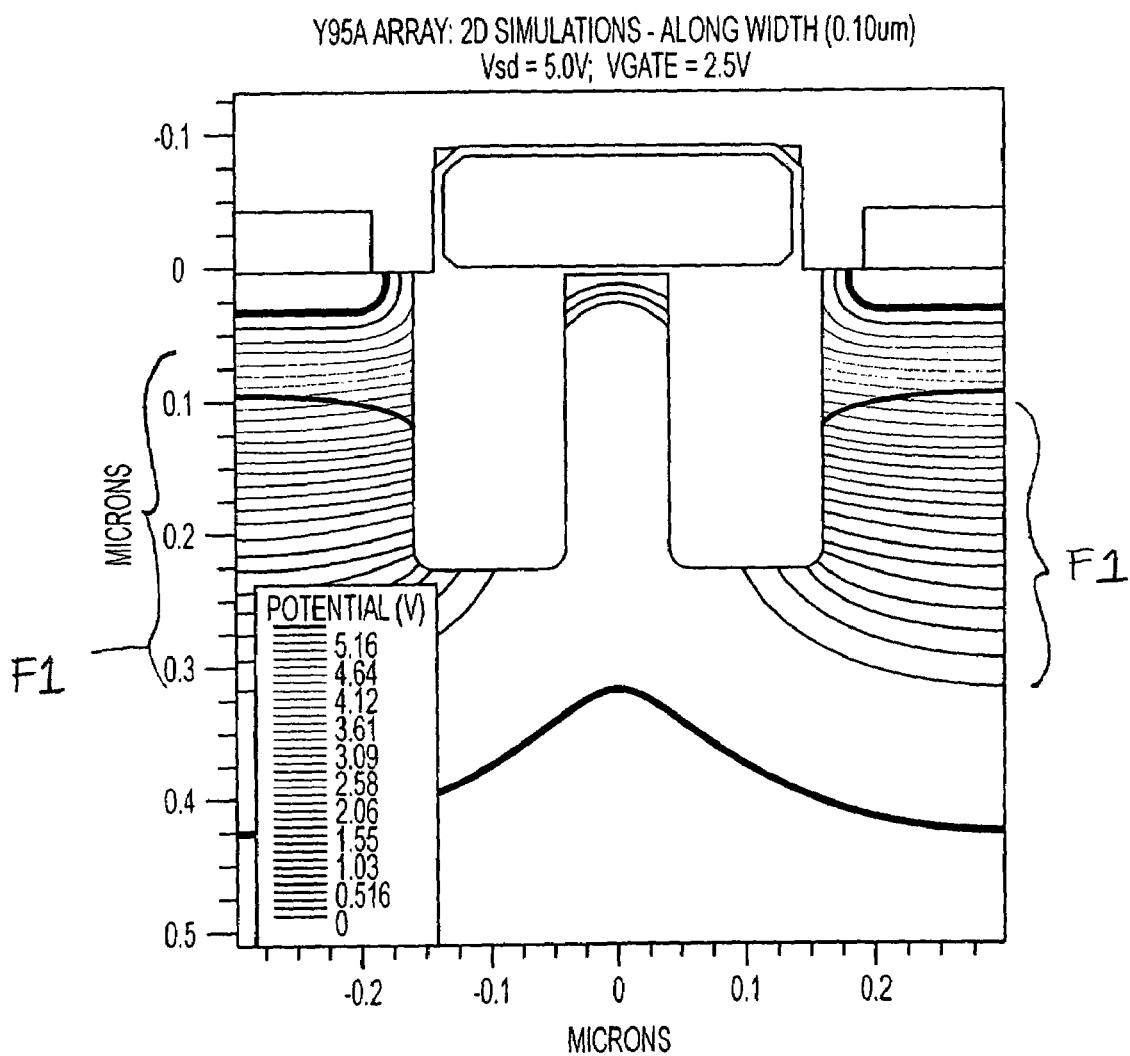
FIG. 2A-2C are images of potential profiles in a silicon substrate during various bias conditions.
Figure 2B:
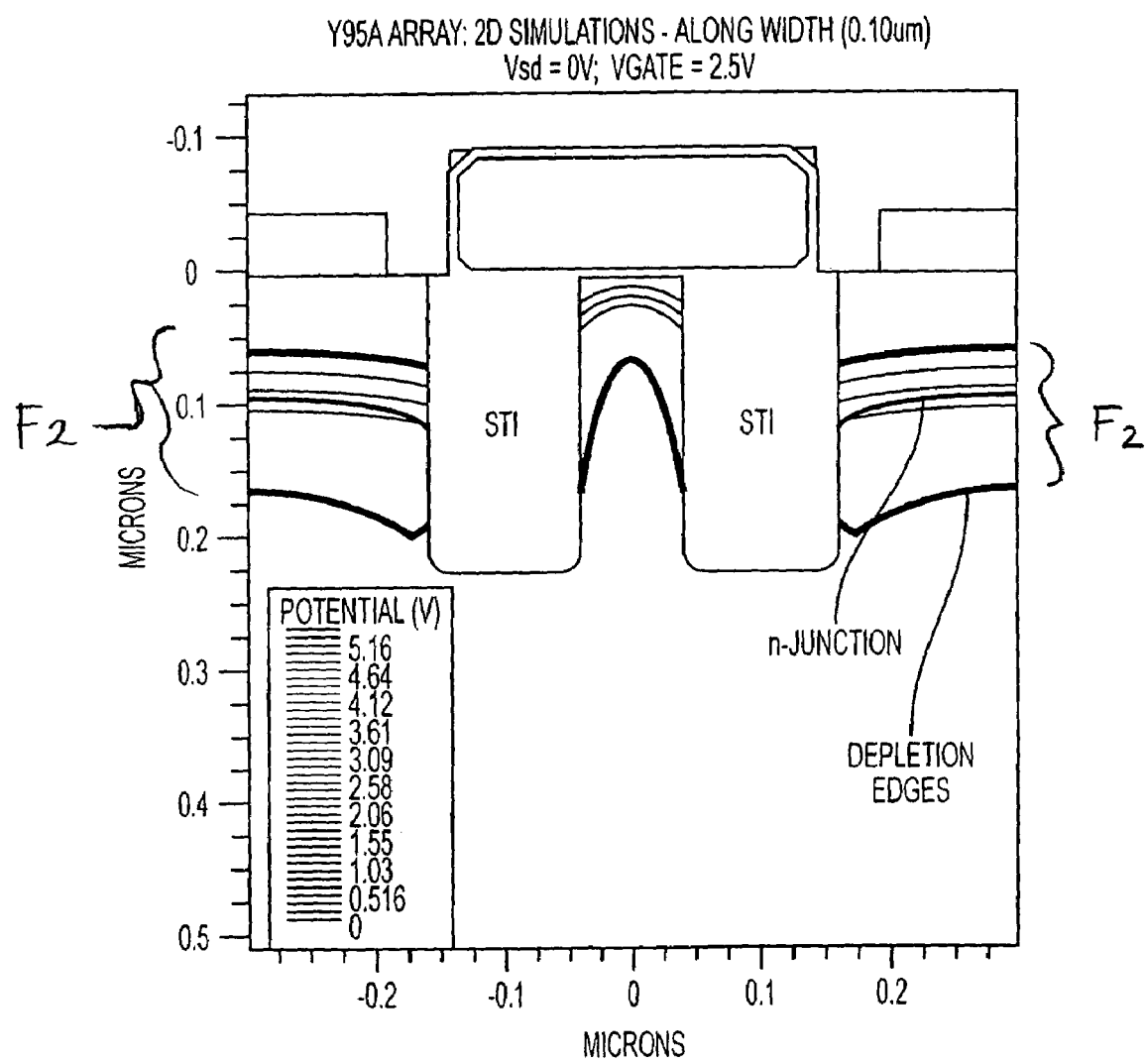
Figure 2C:
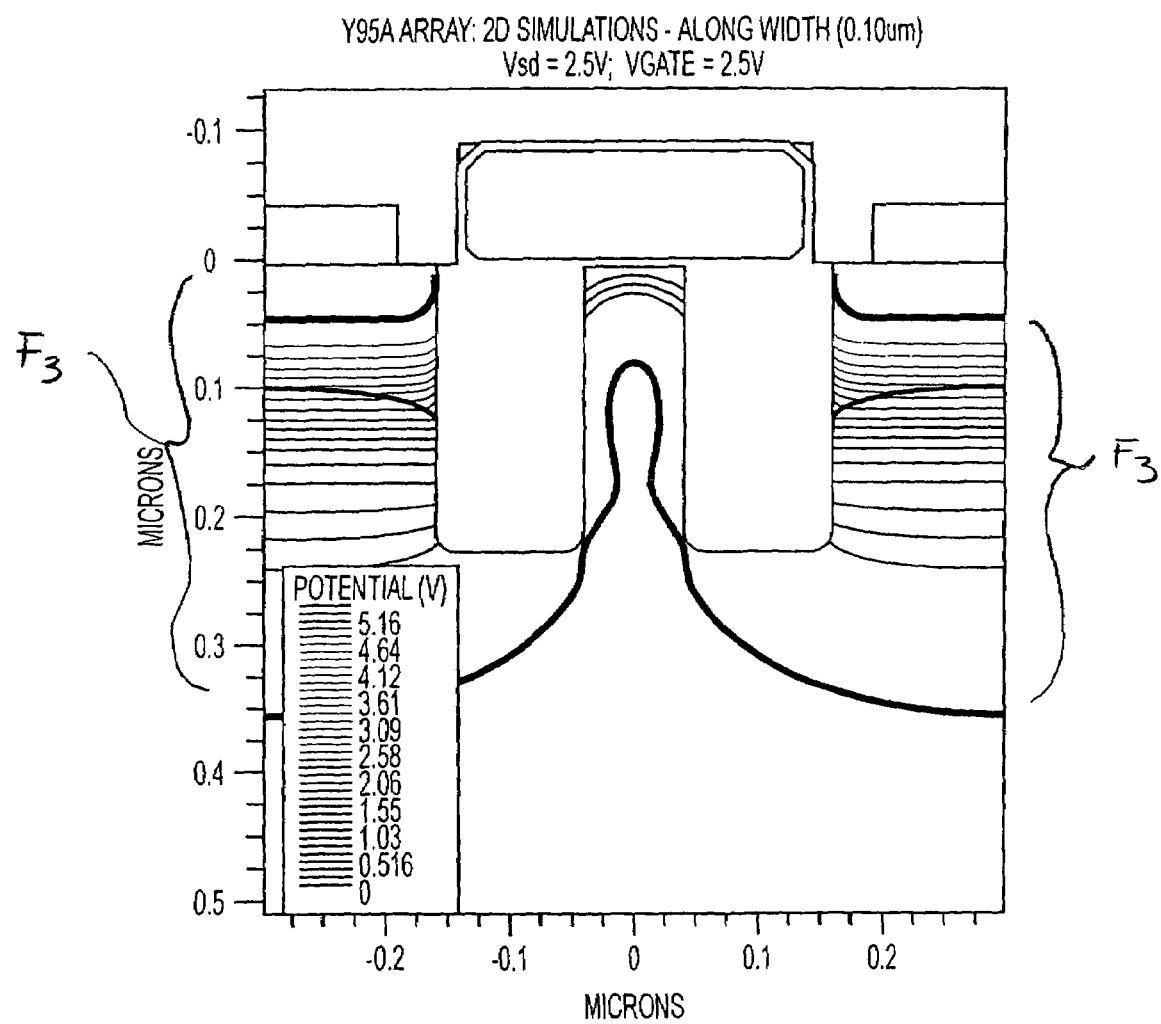

A terminal contact 157 is connected to the transparent metal layer 162 of each isolation region 150. The terminal contact 157 is used to apply a voltage to the transparent metal layer 162, as desired. For example, for use with an NMOS transfer transistor 130, it may be desirable to apply a slightly negative voltage to the transparent metal layer 162 in order to create a hole accumulation region surrounding the isolation region 150. Alternatively, when used with a PMOS transfer transistor 130, the voltage applied would be slightly positive. The applied voltages may be within the range of +/−300 mV, for example. In most instances, however, and especially when the isolation region 150 is incorporated into the periphery of a pixel array, the voltage applied to the transparent metal layer 162 will be used to maintain the isolation region 150 at ground potential. The voltage applied to the isolation region 150 could also be positive or negative when the region 150 is located in the periphery, depending again on whether it is in an NMOS or PMOS region. The appropriate voltage is determined by a mitigation of field lines (see FIGS. 2A-2C) such that charges do not build up in one pixel 100 or flow into adjacent pixels.

FIGS. 4-7 depict an exemplary method of fabricating the isolation region 150 in accordance with the invention. Although FIGS. 4-7 illustrate only a portion of the substrate 110 with only two shallow trench isolation regions 150a, 150b, it must be understood that the present invention contemplates the simultaneous formation of a plurality of shallow trench structures at various locations on the substrate 110 to isolate all of the pixels from one another, and to provide isolation between other pixel array structures.

Figure 4:
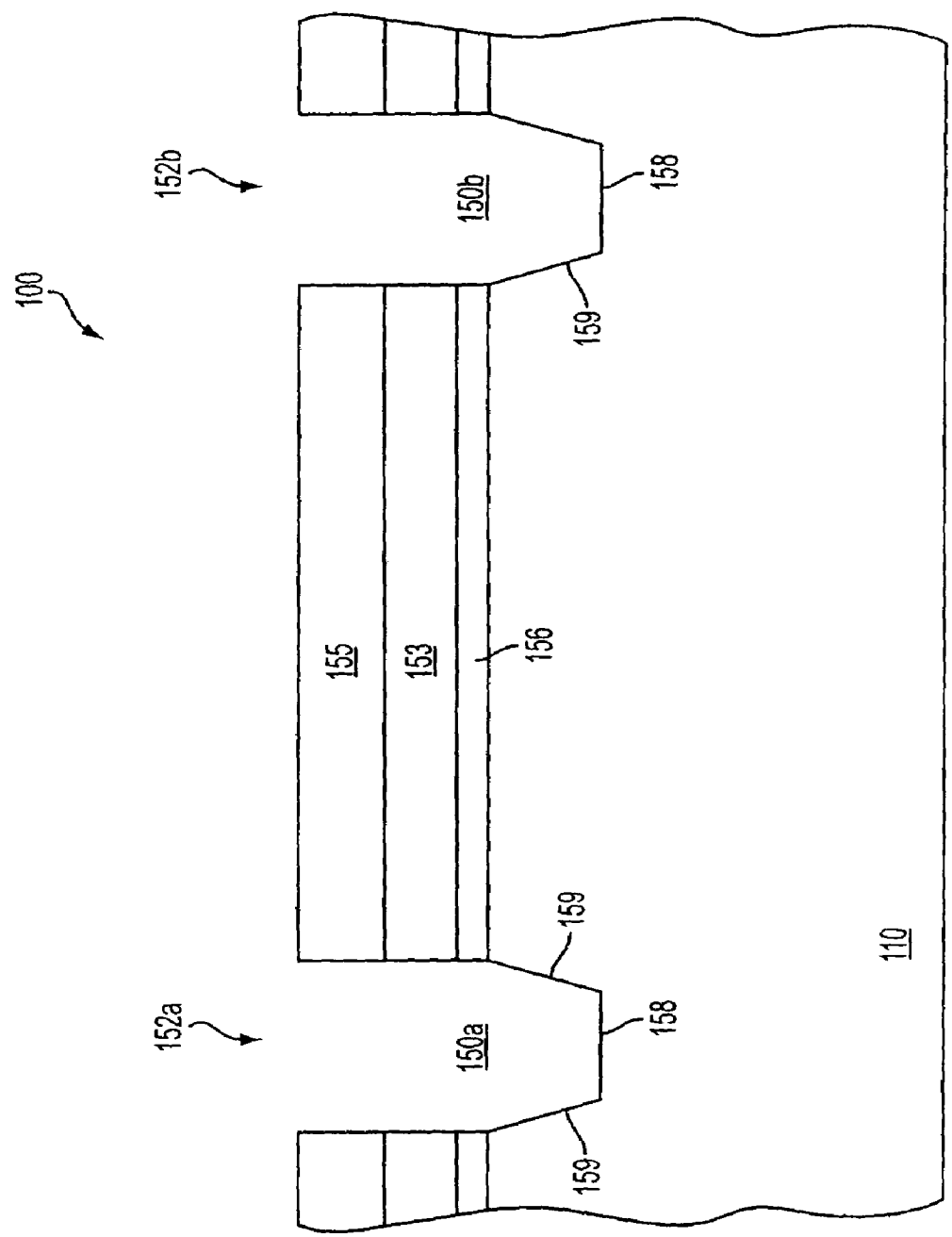
FIG. 4 is a cross-sectional view of the exemplary imager pixel of FIG. 3 during an initial stage of fabrication.

Referring now to FIG. 4, a portion of the pixel 100 is illustrated with a substrate 110 having various layers formed on its upper surface. A blanket layer 153 of a hard mask material, such as silicon nitride, silicon oxide, or other suitable material, is formed over a barrier oxide layer 156 over a top surface of the substrate 110. The barrier oxide layer 156 is typically a grown oxide but can also be a deposited oxide, such as TEOS (tetra ethyl orthosilicate) or HDP (high density plasma) oxide, among others. A photoresist layer 155 is formed over the hard mask layer 153 and then patterned with a mask (not shown) and etched to obtain openings 152a, 152b in layers 156, 153 and 155, as illustrated in FIG. 4. The silicon substrate 110 is then etched to form trenches 150a and 150b. Any suitable etching technique may be used to perform this step.

Figure 5:
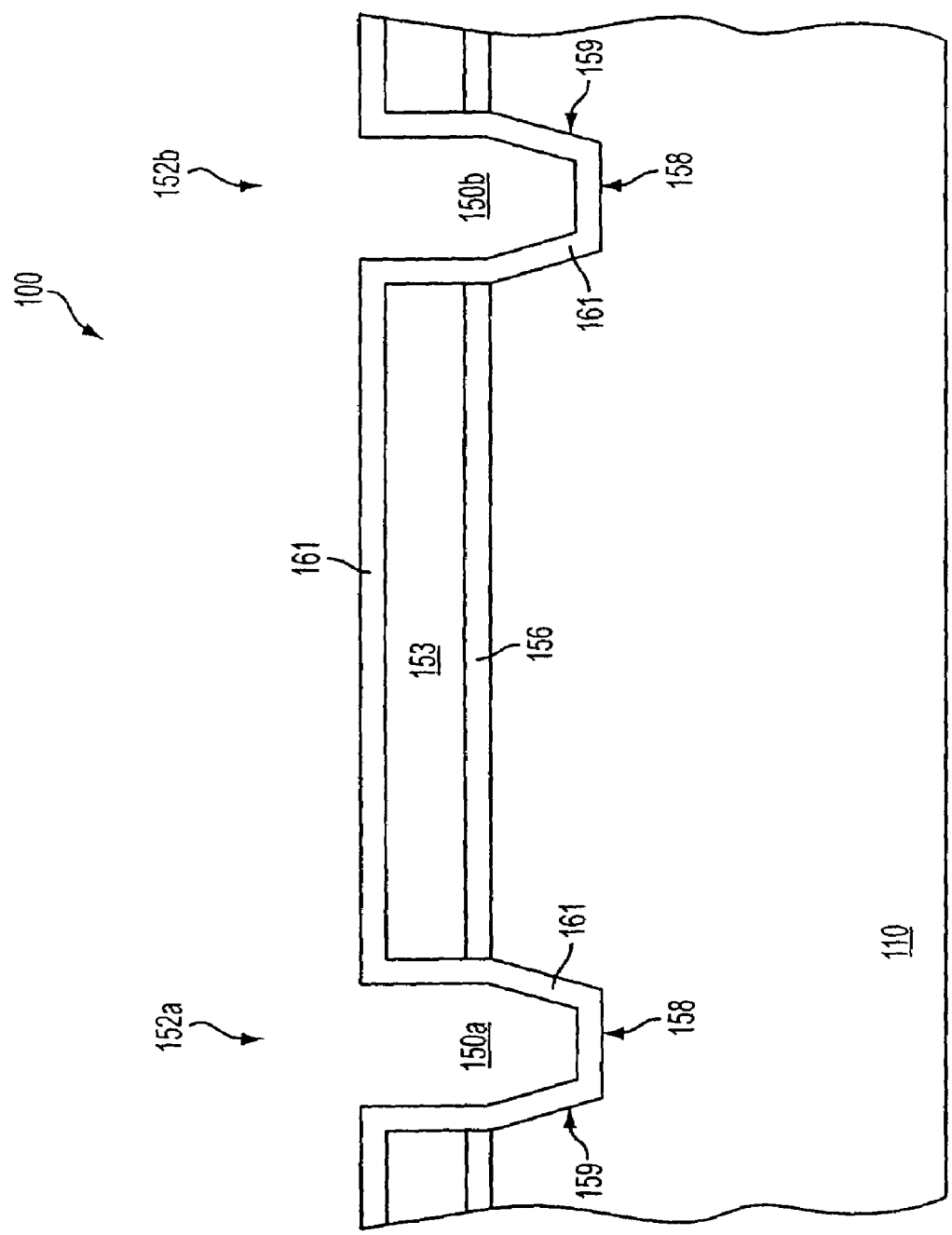
FIG. 5 is a cross-sectional view of the exemplary imager pixel of FIG. 3 during a stage of fabrication subsequent to that shown in FIG. 4.

Referring to FIG. 5, the photoresist layer 155 is stripped typically using an oxygen containing plasma. However, other suitable methods can be equally employed. Next, a thin layer 161 of dielectric material is formed in the trenches 150a, 150b. In one embodiment, the dielectric material is a high density plasma (HDP) oxide, a material which has a high ability to effectively fill narrow trenches. Alternatively, the dielectric layer 161 may be formed using other conventional formation techniques such as sputtering or CVD depositing. The dielectric layer 161 may be formed to a thickness of about 30 to about 200 Angstroms (typically about 60 Angstroms) by blanket depositing the dielectric material to this desired thickness over the surface of the cell 100, thereby coating the sidewalls 159 and the bottom 158 of the trench.

Figure 6:
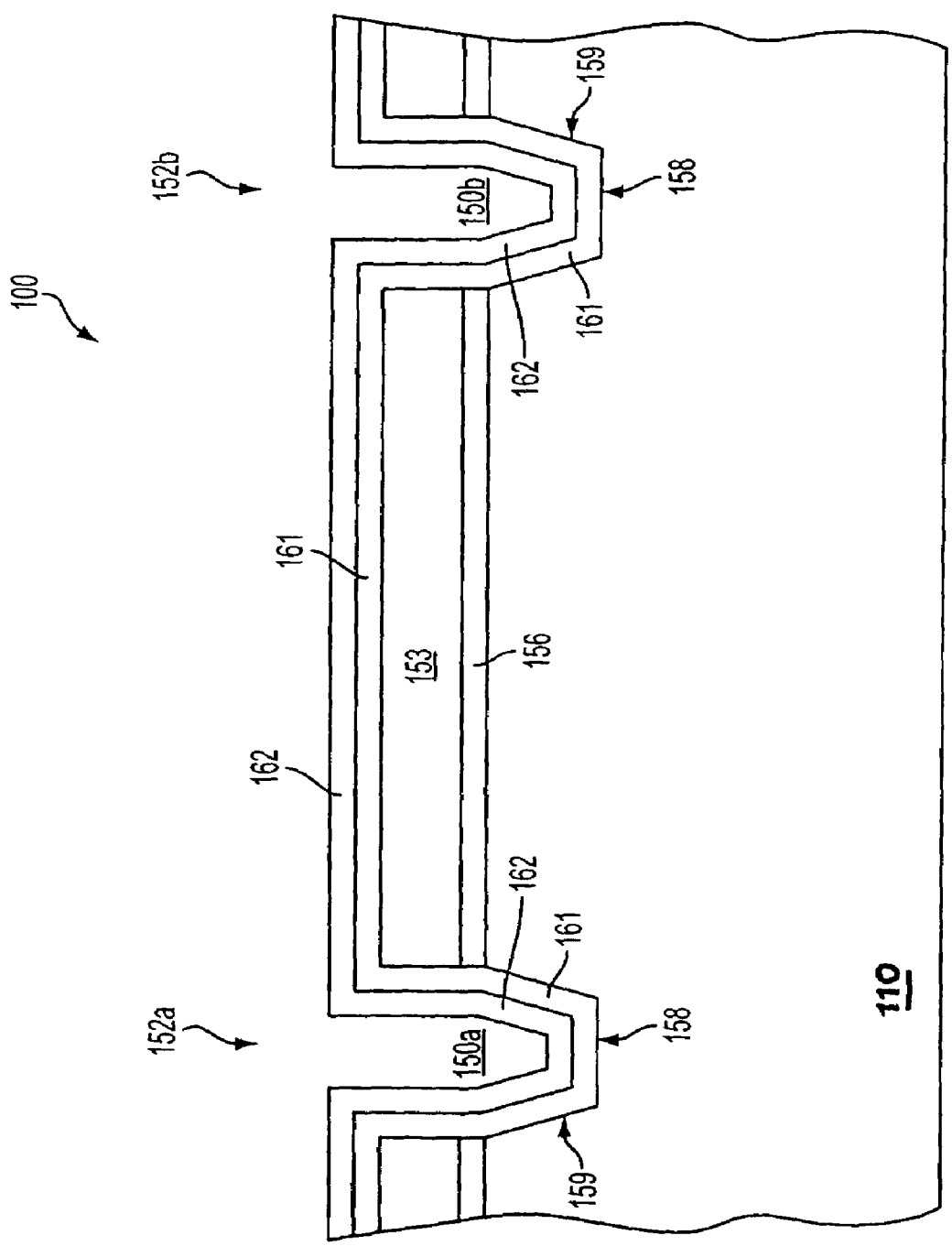
FIG. 6 is a cross-sectional view of the exemplary imager pixel of FIG. 3 during a stage of fabrication subsequent to that shown in FIG. 5.

Referring now to FIG. 6, a layer 162 of a transparent metal material is formed over the dielectric layer. The transparent metal material may be indium tin oxide, indium oxide, tin oxide, or any other conductive material compatible with the selected fabrication materials and transparent to photons. The selected materially should also serve as a shield to electrons within the substrate 110. The transparent metal layer 162 may be formed to a thickness of about 100 to about 1500 Angstroms, preferably about 200 to about 300 Angstroms over the dielectric layer 161, again, by blanket depositing the transparent conductive material over the dielectric layer 161 to the desired thickness. Other methods of forming the transparent metal layer 162 may also be employed. Alternatively, the transparent conductive material may be formed to fill the entire trench area 150a, 150b or a different transparent conductive material may be used to fill the trenches.

Figure 7:
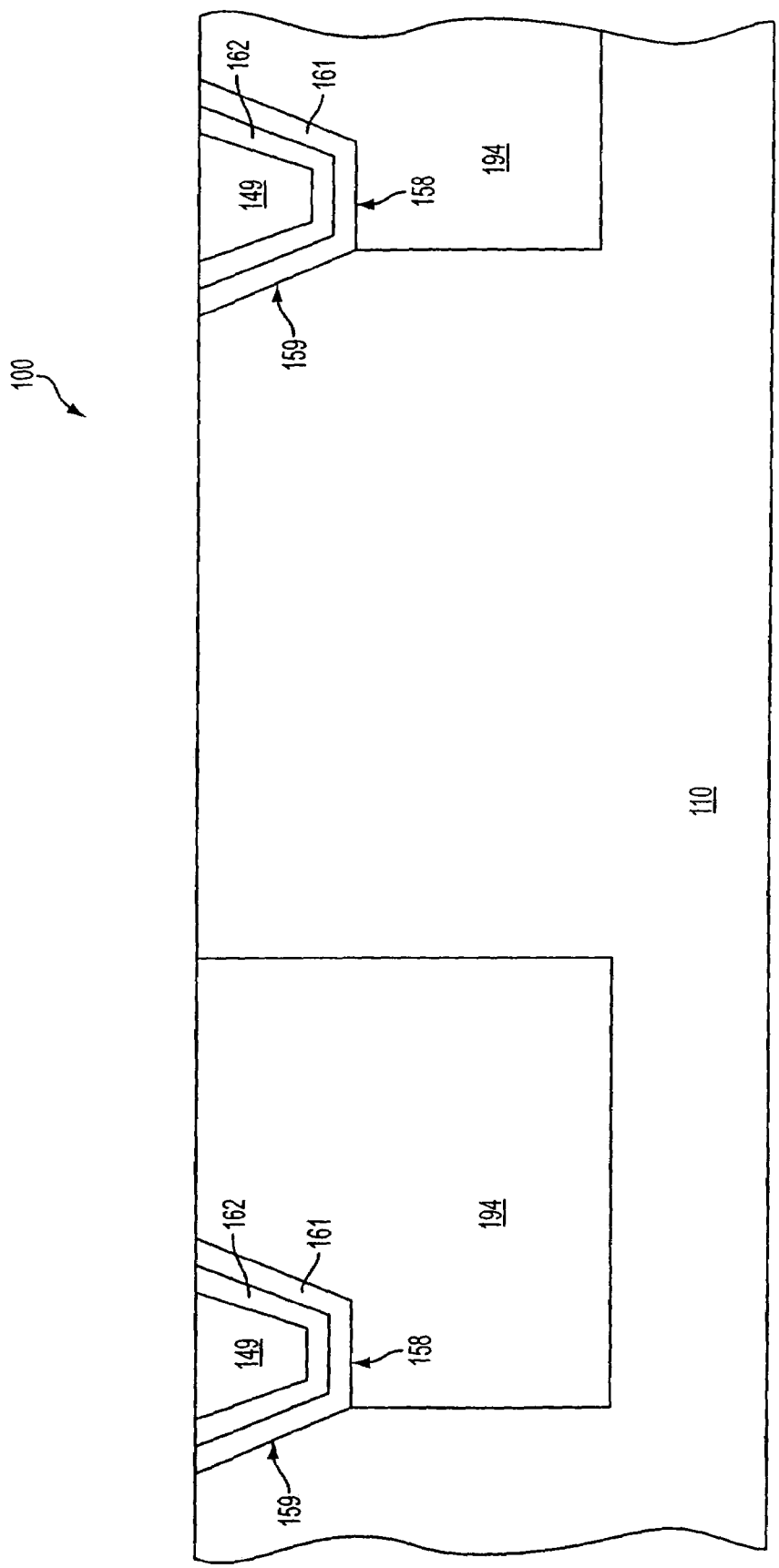
FIG. 7 is a cross-sectional view of the exemplary imager pixel of FIG. 3 during a stage of fabrication subsequent to that shown in FIG. 6.

If the transparent metal material does not fill the entire trench 150a, 150b, a filling step is necessary, and is illustrated in FIG. 7. In FIG. 7, the trench 150a, 150b is filled with an insulator 149, which may be a HDP oxide deposition or an SOD (spin-on dielectric) oxide, such that trench isolation regions 150a, 150b are completely filled. Preferably, the insulator 149 is also transparent to photons. The wafer is planarized with known techniques such as CMP, or by dry etch techniques such as resist etch-back to create a planar surface for the isolation regions 150a, 150b with the top of the substrate. Still referring to FIG. 7, the hard mask layer 153 is removed by conventional techniques, such as wet or dry etching, to complete the formation of trench isolation regions 150a, 150b.

At this stage, the isolation regions 150 are complete, and other processing steps are carried out to complete formation of the pixel 100. For example, each of the transistors, 130, 135, 127, and 127 may be formed using techniques as known in the art. Accumulation region 126 and charge storage region 129 may be formed by doping the region of the substrate 110 with n-type dopants. Additionally, p-wells 194 and p+ surface region 124 may be formed by doping the areas of the substrate 110 with an appropriate p− type dopant to a desired concentration.

FIG. 8 illustrates a block diagram of an exemplary CMOS imager 308 having a pixel array 240 comprising a plurality of pixels arranged in a predetermined number of columns and rows, with each pixel cell 100 being constructed in accordance with the exemplary embodiments described above. Attached to the array 240 is signal processing circuitry, at least part of which may be formed in the substrate. The pixels of each row in array 240 are all turned on at the same time by a row select line, and the pixels of each column are selectively output by respective column select lines. A plurality of row and column lines are provided for the entire array 240. The row lines are selectively activated by a row driver 245 in response to row address decoder 255. The column select lines are selectively activated by a column driver 260 in response to column address decoder 270. Thus, a row and column address is provided for each pixel.

The CMOS imager 308 is operated by the timing and control circuit 250, which controls address decoders 255, 270 for selecting the appropriate row and column lines for pixel readout. The control circuit 250 also controls the row and column driver circuitry 245, 260 such that they apply driving voltages to the drive transistors of the selected row and column lines. The pixel column signals, which typically include a pixel reset signal ($V_{rst}$) and a pixel image signal ($V_{sig}$), are read by a sample and hold circuit 261. $V_{rst}$ is read from a pixel 100 immediately after the charge storage region 115 (FIG. 3) is reset by the reset gate 117. $V_{sig}$ represents the amount of charges generated by the photosensitive element 188 in response to applied light to the pixel 100. A differential signal ($V_{rst}$–$V_{sig}$) is produced by differential amplifier 262 for each pixel, which is digitized by analog-to-digital converter 275 (ADC). The analog to digital converter 275 supplies the digitized pixel signals to an image processor 280 which forms and outputs a digital image.

FIG. 9 illustrates a processor system 1100 including an imaging device 308, which has pixels constructed in accordance with the methods described herein. The processor system 1100 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and data compression system.

The processor-system 1100, for example a camera system, generally comprises a central processing unit (CPU) 1102, such as a microprocessor, that communicates with an input/output (I/O) device 1106 over a bus 1104. Imaging device 308 also communicates with the CPU 1102 over the bus 1104. The processor system 1100 also includes random access memory (RAM) 1110, and can include removable memory 1115, such as flash memory, which also communicates with CPU 1102 over the bus 1104. Imaging device 308 may be combined with a processor, such as a CPU, digital signal processor, or microprocessor, with or without memory storage on a single integrated circuit or on a different chip than the processor.

The above description and drawings are only to be considered illustrative of exemplary embodiments which achieve the features and advantages of the invention. Modification of, and substitutions to, specific process conditions and structures can be made without departing from the spirit and scope of the invention. Accordingly, the invention is not to be considered as being limited by the foregoing description and drawings, but is only limited by the scope of the appended claims.

What is claimed as new and desired to be protected by Letters Patent of the United States is:

1. A method of forming an isolation region, the method comprising the acts of:
    forming a first element in a substrate;
    forming a second element in the substrate;
    forming a trench in the substrate between the first element and the second element to electrically isolate the first element from the second element, the trench having sidewalls and a bottom;
    lining at least one of said sidewalls and said bottom with a dielectric material; and
    forming a transparent conductive layer over said dielectric lining and within said trench.

2. The method of claim 1, wherein said step of lining comprises depositing at least one of silicon oxide, silicon dioxide, oxy-nitride, silicon nitride, and silicon carbide in the trench.

3. The method of claim 2, wherein said step of lining comprises lining each of the sidewalls and the bottom of said trench with the dielectric material.

4. The method of claim 3, wherein the transparent conductive layer is formed contiguous with the dielectric material.

5. The method of claim 1, further comprising the step of planarizing said dielectric material and said transparent conductive layer such that said trench is planar with the substrate.

6. The method of claim 1, wherein said isolation region is a shallow trench isolation region.

7. The method of claim 1, further comprising the step of filling the trench with a filler material.

8. The method of claim 7, wherein the filler material comprises a dielectric material.

9. The method of claim 7, wherein the filler material comprises a transparent conductive material.

10. A method of fabricating a pixel sensor cell, the method comprising:
    forming a photosensitive element in a substrate;
    forming a second element in the substrate;
    forming a trench between the photosensitive element and the second element so as to electrically isolate the photosensitive element from the second element in the substrate; and
    forming a transparent conductive layer in the trench.

11. The method of claim 10, further comprising the step of lining the trench with a dielectric material prior to forming a transparent conductive layer in the trench.

12. The method of claim 11, further comprising the step of filling the trench with a dielectric material over the formed transparent conductive layer.

13. The method of claim 10, wherein said step of forming a transparent conductive layer comprises depositing a metal layer over a dielectric material lining the trench.

14. The method of claim 13, wherein said step of forming a transparent conductive layer comprises filling the trench with the transparent metal material.

15. The method of claim 14, wherein the metal layer is formed to a height that is level with a top surface of the substrate.

16. The method of claim 10, wherein the transparent conductive layer comprises indium tin oxide.

17. The method of claim 10, further comprising the step of forming a contact that is adapted to receive a voltage at the transparent metal layer.

18. A method of forming an isolation region, the method comprising the acts of:
- forming a trench in a substrate, the trench having sidewalls and a bottom;
- lining at least one of said sidewalls and said bottom with a dielectric material; and
- forming a transparent conductive layer over said dielectric lining, wherein said transparent conductive layer comprises indium tin oxide and has a thickness of about 200 to about 300 Angstroms.

19. The method of claim 18, wherein said lining step comprises lining each of the sidewalls and the bottom of said trench with the dielectric material.

20. The method of claim 18, further comprising connecting the transparent conductive layer to a terminal contact for applying a voltage to the transparent conductive layer.

* * * * *